US012756151B2

(12) United States Patent
Shirasaki

(10) Patent No.: US 12,756,151 B2
(45) Date of Patent: Oct. 6, 2026

(54) PACKAGE FOR ACCOMMODATING ELECTRONIC ELEMENT, AND ELECTRONIC DEVICE

(71) Applicant: KYOCERA Corporation, Kyoto (JP)

(72) Inventor: Takayuki Shirasaki, Kirishima (JP)

(73) Assignee: Kyocera Corporation, Kyoto (JP)

( * ) Notice: Subject to any disclaimer, the term of this patent is extended or adjusted under 35 U.S.C. 154(b) by 523 days.

(21) Appl. No.: 18/286,856

(22) PCT Filed: Apr. 5, 2022

(86) PCT No.: PCT/JP2022/017091
§ 371 (c)(1),
(2) Date: Oct. 13, 2023

(87) PCT Pub. No.: WO2022/220176
PCT Pub. Date: Oct. 20, 2022

(65) Prior Publication Data

US 2024/0195142 A1 Jun. 13, 2024

(30) Foreign Application Priority Data

Apr. 14, 2021 (JP) ................................ 2021-068471

(51) Int. Cl.
*H01S 5/022* (2021.01)
*H01P 3/06* (2006.01)

(52) U.S. Cl.
CPC ................ *H01S 5/022* (2013.01); *H01P 3/06* (2013.01)

(58) Field of Classification Search
CPC ............. H01S 5/022; H01P 3/06; H01P 5/085
See application file for complete search history.

(56) References Cited

U.S. PATENT DOCUMENTS

2006/0284699 A1* 12/2006 Weiske .................. H01P 5/085 333/33
2022/0247060 A1* 8/2022 Asahi ..................... H01P 5/085

FOREIGN PATENT DOCUMENTS

JP 2002118190 A * 4/2002 ....... H01L 2224/480
JP 2007-123950 A 5/2007

* cited by examiner

*Primary Examiner* — Yuanda Zhang
(74) *Attorney, Agent, or Firm* — Volpe Koenig

(57) ABSTRACT

A signal line includes a first section, a second section, and a third section. A width of a signal conductor in the second section is constant, is less than or equal to a width of the signal conductor in the first section, and is greater than a width of the signal conductor in a center portion of the third section. A distance between the signal conductor and each first ground conductor is constant in the second section, is less than the distance in the first section, and is greater than the distance in the center portion of the third section. The second section has a length of from ⅓ times to 3/2 times a distance H between the signal conductor and a second ground conductor on a side opposite to the coaxial line from a position at which a distal end portion of a pin terminal is present.

5 Claims, 9 Drawing Sheets

PACKAGE FOR ACCOMMODATING ELECTRONIC ELEMENT, AND ELECTRONIC DEVICE

TECHNICAL FIELD

The present disclosure relates to a package for accommodating an electronic element and to an electronic device.

BACKGROUND OF INVENTION

Japanese Unexamined Patent Application Publication No. 2007-123950 discloses a high-frequency signal converter including a coaxial line located in a wall and a planar substrate connected to the coaxial line on a side of the wall.

SUMMARY

Solution to Problem

A package for accommodating an electronic element according to the present disclosure includes:

- a base including a wall and an accommodating portion surrounded by the wall;
- a coaxial line located in the wall; and
- a signal line connected to the coaxial line on a side of the wall,
- the coaxial line includes a pin terminal protruding from the wall,
- the signal line includes an insulation plate including a first surface and a second surface on a side opposite to the first surface, a signal conductor located on the first surface and connected to the pin terminal, first ground conductors located on the first surface with the signal conductor interposed between the first ground conductors, and a second ground conductor located on the second surface,
- the signal line includes, in order from the coaxial line side, a first section, a second section, and a third section,
- a width of the signal conductor in the second section is constant, is less than or equal to a width of the signal conductor in the first section, and is greater than a width of the signal conductor in a center portion of the third section,
- a distance between the signal conductor and each of the first ground conductors is constant in the second section, is less than the distance in the first section, and is greater than the distance in the center portion of the third section, and
- the second section has a length of from ⅓ times to 3/2 times a distance H between the signal conductor and the second ground conductor on a side opposite to the coaxial line from a position at which a distal end portion of the pin terminal is present as viewed in a direction perpendicular to the first surface.

An electronic device according to the present disclosure includes:

- the package for accommodating an electronic element, described above; and
- an electronic element accommodated in the package for accommodating an electronic element.

DESCRIPTION OF EMBODIMENTS

Hereinafter, embodiments of the present disclosure will be described in detail with reference to the drawings.

Figure 1A:
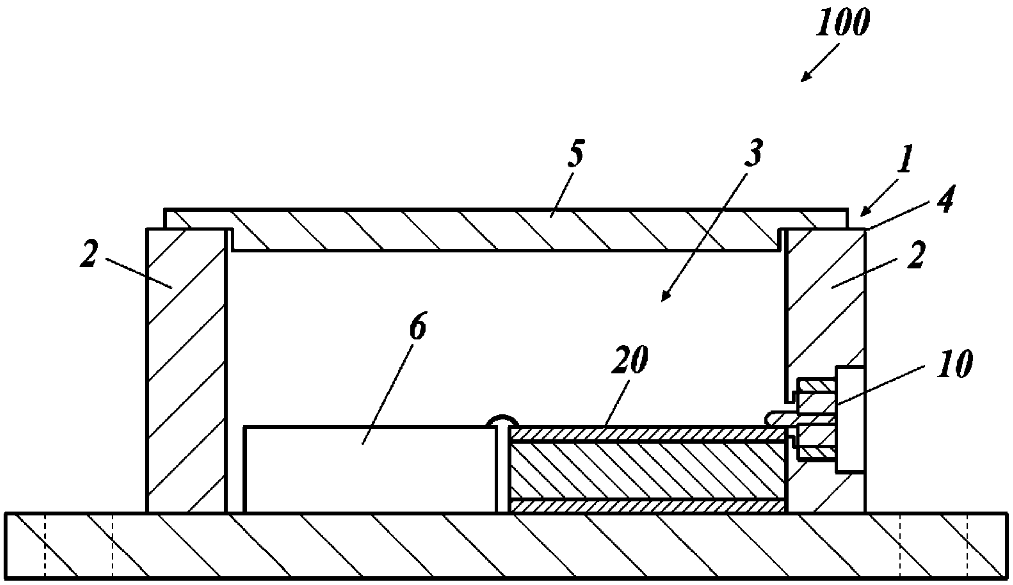
FIG. 1A is a cross-sectional view of a package for accommodating an electronic element and an electronic device according to an embodiment of the present disclosure.
Figure 1B:
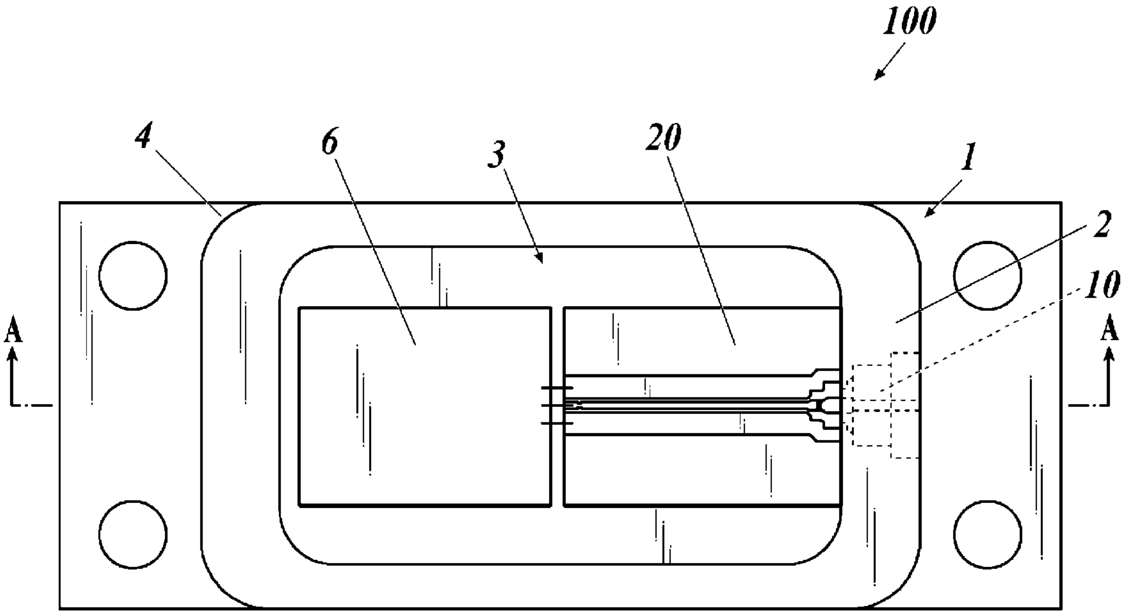
FIG. 1B is a plan view of the package for accommodating an electronic element and the electronic device according to the embodiment of the present disclosure.

FIG. 1A is a cross-sectional view of a package for accommodating an electronic element and an electronic device according to an embodiment of the present disclosure. FIG. 1B is a plan view of the package for accommodating an electronic element and the electronic device according to the embodiment of the present disclosure. FIG. 1A is a cross-sectional view taken along line A-A in FIG. 1B. FIG. 1B illustrates a configuration without a lid 5.

The electronic device 100 according to the embodiment of the present disclosure includes a package 1 for accommodating an electronic element and an electronic element 6 accommodated in an accommodating portion 3 of the package 1 for accommodating an electronic element. The electronic element 6 is configured to perform both or one of receiving and outputting high-frequency signals and is, for example, a semiconductor laser element configured to convert high-frequency electrical signals into optical signals. The electronic element 6 may be an LN ($LiNbO_3$) element configured to modulate laser light passing through an optical waveguide with high-frequency electrical signals. Besides these examples, the electronic element 6 may be any element configured to perform both or one of receiving and outputting high-frequency signals and is not particularly limited.

The package 1 for accommodating an electronic element includes a base 4 including a wall 2 and the accommodating portion 3 surrounded by the wall 2, a coaxial line 10 located in the wall 2, a signal line 20 located on a side of the wall 2, and the lid 5 closing an opening of the accommodating portion 3. The base 4 may be made of a metal. Although the signal line 20 is located inside the wall 2 (on the accommodating portion 3 side), the signal line 20 may be located outside the wall 2. Hereinafter, the combination of the coaxial line 10 and the signal line 20 is referred to as "transmission line".

Figure 2:
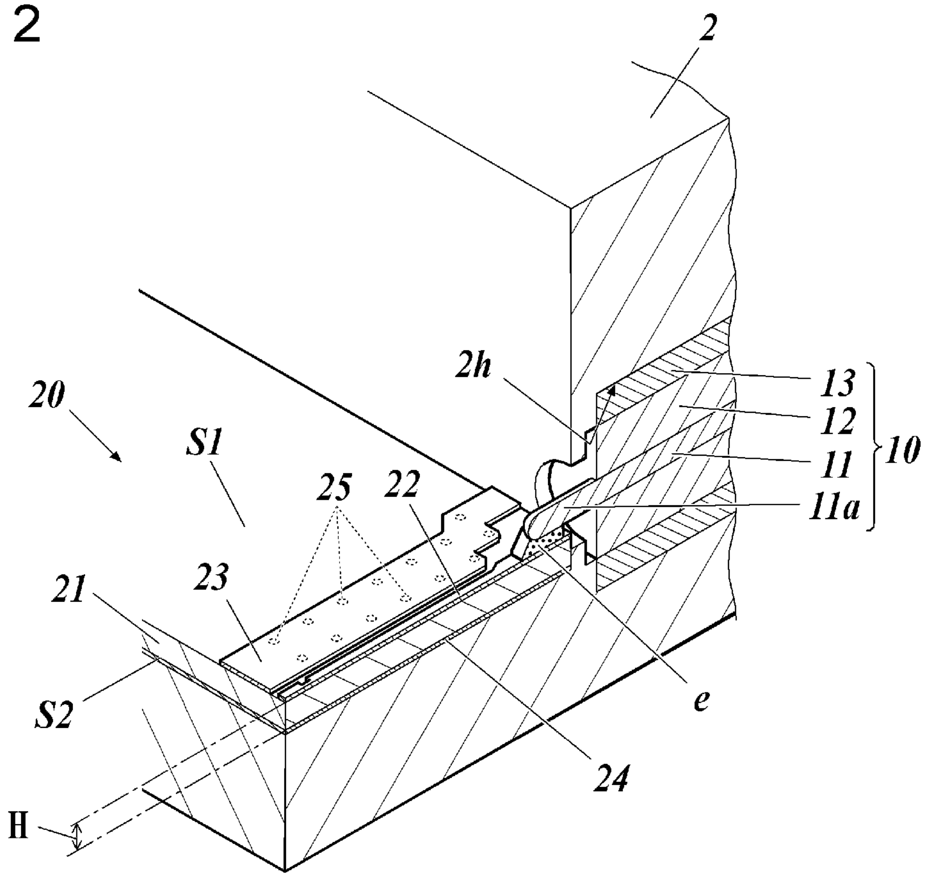
FIG. 2 is a cross-sectional perspective view of a portion including a transmission line of the package for accommodating an electronic element according to the embodiment.
Figure 3:
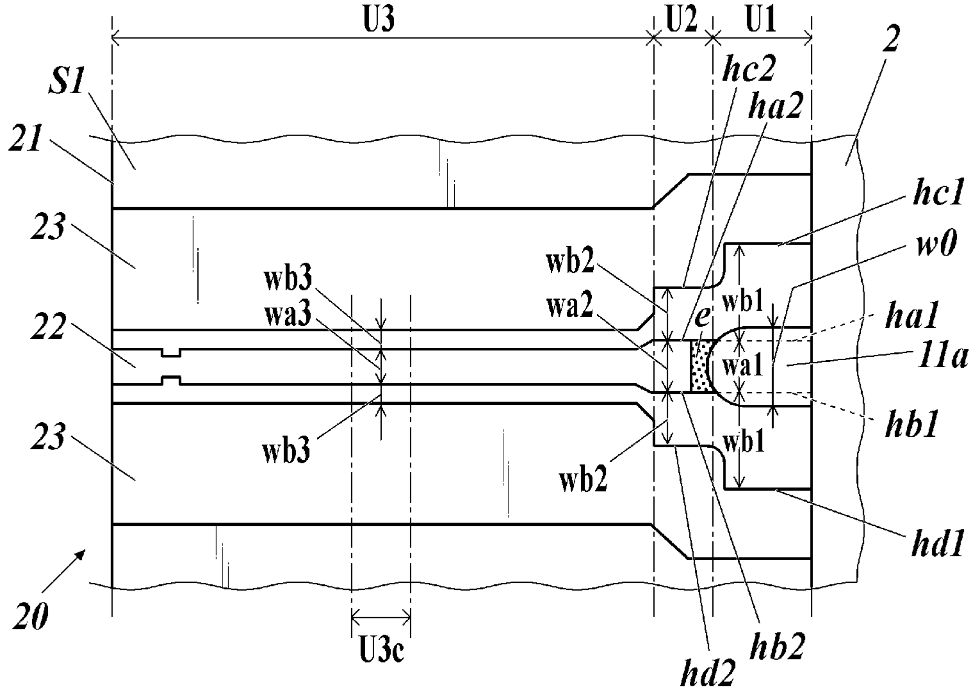
FIG. 3 is a plan view of the transmission line according to the embodiment.

FIG. 2 is a cross-sectional perspective view of part of the transmission line of the package for accommodating an electronic element according to the embodiment. FIG. 3 is a plan view of the transmission line according to the embodiment.

As illustrated in FIG. 2, the coaxial line 10 includes an inner conductor 11, which is a core line, a dielectric 12 located around the inner conductor 11, a tubular outer conductor 13 covering the radial outer side of the inner conductor 11, and a pin terminal 11*a* continuous with the inner conductor 11 and protruding from the dielectric 12. The pin terminal 11*a* extends along the center axis of the inner conductor 11. The space between the inner conductor 11 and the outer conductor 13 is sealed with the dielectric 12.

The coaxial line 10 is located in the wall 2 (specifically, in a through hole 2*h* of the wall 2) and transmits high-frequency signals between the inside and the outside of the accommodating portion 3. The pin terminal 11*a* protrudes from the wall 2 to the inside of the wall 2 (on the accommodating portion 3 side).

As illustrated in FIGS. 2 and 3, the signal line 20 is plate-shaped and includes an insulation plate 21 including a first surface S1 and a second surface S2, a signal conductor 22 located on the first surface S1 and connected to the pin terminal 11*a*, first ground conductors 23 located on the first surface S1 with the signal conductor 22 interposed between the first ground conductors 23, and a second ground conductor 24 located on the second surface S2. The first surface S1 is located on a side opposite to the second surface S2. The insulation plate 21 is a dielectric and may be a ceramic. The signal line 20 may also be referred to as a coplanar line with a backside conductor.

The signal conductor 22, the first ground conductors 23, and the second ground conductor 24 are film-shaped. The second ground conductor 24 is opposed to the signal conductor 22 and the first ground conductors 23 and spreads out on the second surface S2.

The signal line 20 further includes a plurality of via conductors 25 connecting the first ground conductors 23 and the second ground conductor 24. Each via conductor 25 extends from the first surface S1 to the second surface S2 of the insulation plate 21. In FIG. 2, upper end portions of the via conductors 25 are illustrated with dashed lines, and each via conductor 25 extends in the direction perpendicular to the first surface S1 from the first surface S1 to the second surface S2.

The width and thickness of the signal conductor 22, the distance between the signal conductor 22 and each first ground conductor 23, the distance between the signal conductor 22 and the second ground conductor 24, and the intervals between the plurality of via conductors 25 are set according to the frequency of a transmission signal and the relative permittivity of the insulation plate 21 so as to achieve specified impedance matching. The signal frequency is assumed to be in an 80 GHz band or higher. The distance H between the signal conductor 22 and the second ground conductor 24 is ¼ or less of the effective wavelength of a high-frequency signal, and the intervals of the plurality of via conductors 25 are ½ or less of the effective wavelength of the high-frequency signal.

Since the periphery of the connection portion between the signal line 20 and the coaxial line 10 is a portion where the transmission mode of a high-frequency signal changes, the dimensions and shape of the signal conductor 22 in this portion and the dimensions and shapes of the portions between the signal conductor 22 and the first ground conductors 23 are different from those of the other portions of the signal line 20.

As illustrated in FIG. 3, the signal line 20 includes, in order from the coaxial line 10 side in the direction of the signal conductor 22, a first section U1, a second section U2, and a third section U3.

The first section U1 is from the end of the signal line 20 on the wall 2 side to the position at which the distal end portion of the pin terminal 11*a* is present as viewed in the direction perpendicular to the first surface S1. The second section U2 has a length of from H/3 to 3H/2 in a direction opposite to the coaxial line 10 from the position at which the distal end portion of the pin terminal 11*a* is present as viewed in the direction perpendicular to the first surface S1. The third section U3 is from the end of the second section U2 on a side opposite to the coaxial line 10 to the end of the signal line 20 on the side opposite to the coaxial line 10. The length H mentioned above is the distance between the signal conductor 22 and the second ground conductor 24. The distal end portion of the pin terminal 11*a* corresponds to not only the distal end of the pin terminal 11*a* in the strict sense but also a portion having a slight width from the distal end toward the proximal end. The slight width may be a length to a degree that the influence on high-frequency signal transmission characteristics can be disregarded and corresponds to, for example, a length of 1/16 or less of the effective wavelength λ of a high-frequency signal.

In a main range of the third section U3, the width wa3 of the signal conductor 22 is constant, and the distance wb3 between the signal conductor 22 and each first ground conductor 23 is constant. However, since a portion close to the end of the signal line 20 is connected to another transmission line, the shapes and dimensions of the signal conductor 22 and the first ground conductors 23 may be different from those in a center portion U3*c* of the third section U3. In the third section U3, since portions adjoining the second section U2 are continuous with the signal conductor 22 and the first ground conductors 23 in the second section U2, these portions may include a slope or a round shape. In other words, although the width wa3 of the signal conductor 22 and the distance wb3 between the signal conductor 22 and each first ground conductor 23 are not constant in a start end portion and a terminal end portion of the third section U3, they are constant in the center portion U3*c* of the third section U3.

In the first section U1, the width wa1 of the signal conductor 22 is greater than the width wa3 in the center portion U3*c* of the third section U3, and the distance wb1 between the signal conductor 22 and each first ground conductor 23 is greater than the distance wb3 in the third section U3.

In the first section U1, the left and right sides ha1 and hb1 of the signal conductor 22 may include portions parallel to the longitudinal direction of the signal conductor 22. The longitudinal direction of the signal conductor 22 is the direction along the center line passing through the center of the width of the signal conductor 22. In the first section U1, two inner sides hc1 and hd1 (on the sides closer to the signal conductor 22) of the first ground conductors 23 may include portions parallel to the longitudinal direction of the signal conductor 22.

In the second section U2, the width wa2 of the signal conductor 22 is constant, is less than or equal to the width wa1 in the first section U1, and is greater than the width wa3 in the third section U3. In the second section U2, the distance wb2 between the signal conductor 22 and each first ground conductor 23 is constant, is less than the distance wb1 mentioned above in the first section U1, and is greater than the distance wb3 mentioned above in the center portion U3*c* of the third section U3.

In the second section U2, the left and right sides ha2 and hb2 of the signal conductor 22 are parallel to the longitudinal direction of the signal conductor 22. The longitudinal direction of the signal conductor 22 is the direction along the center line passing through the center of the width of the signal conductor 22. In the second section U2, two inner sides hc2 and hd2 (on the sides closer to the signal conductor 22) of the first ground conductors 23 are parallel to the longitudinal direction of the signal conductor 22.

In the second section U2, the width wa2 of the signal conductor 22 is less than the diameter w0 of the pin terminal 11*a*. The width wa1 of the signal conductor 22 in the first section U1 may be less than the diameter w0 of the pin terminal 11*a* and may be equal to the width wa2 in the second section U2.

The pin terminal 11*a* is joined mainly to the signal conductor 22 in the first section U1 with a conductive joining material e interposed therebetween.

<High-Frequency Characteristics>

Figure 4A:
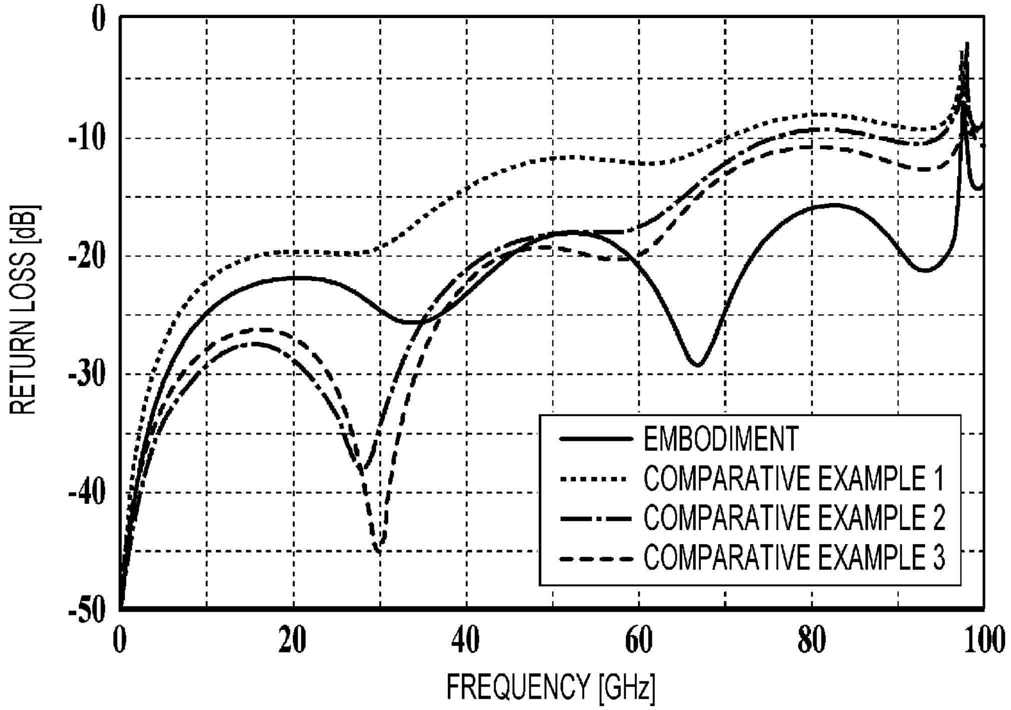
FIG. 4A is a graph illustrating the reflection characteristics of transmission lines of the embodiment and Comparative Examples 1 to 3.
Figure 4B:
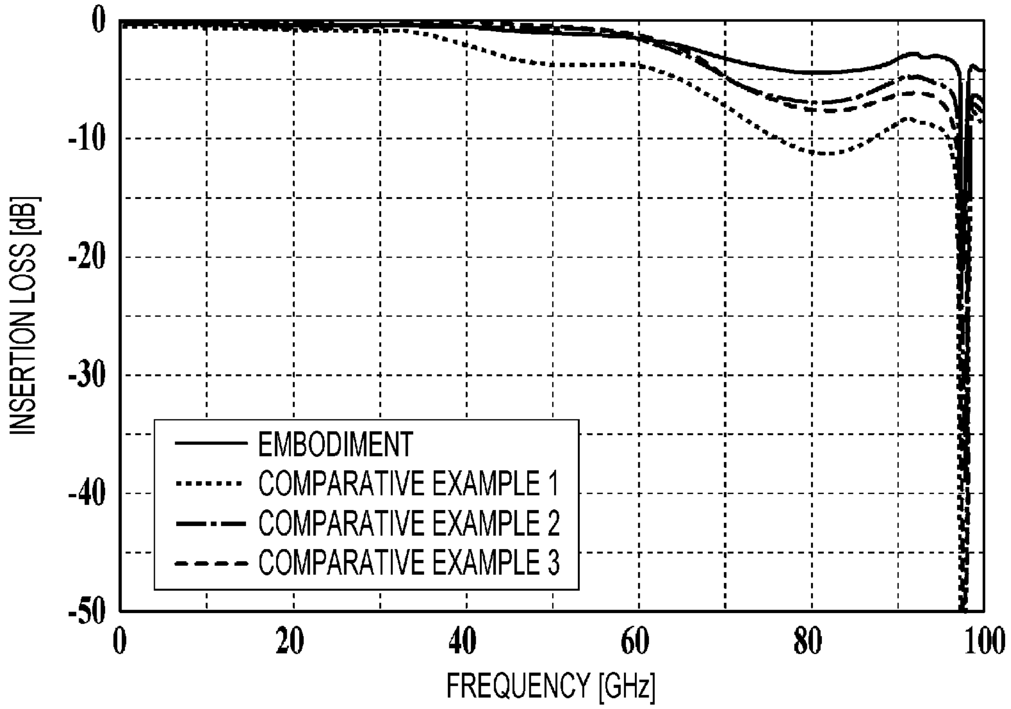
FIG. 4B is a graph illustrating the transmission characteristics of the transmission lines of the embodiment and Comparative Examples 1 to 3.
Figure 5A:
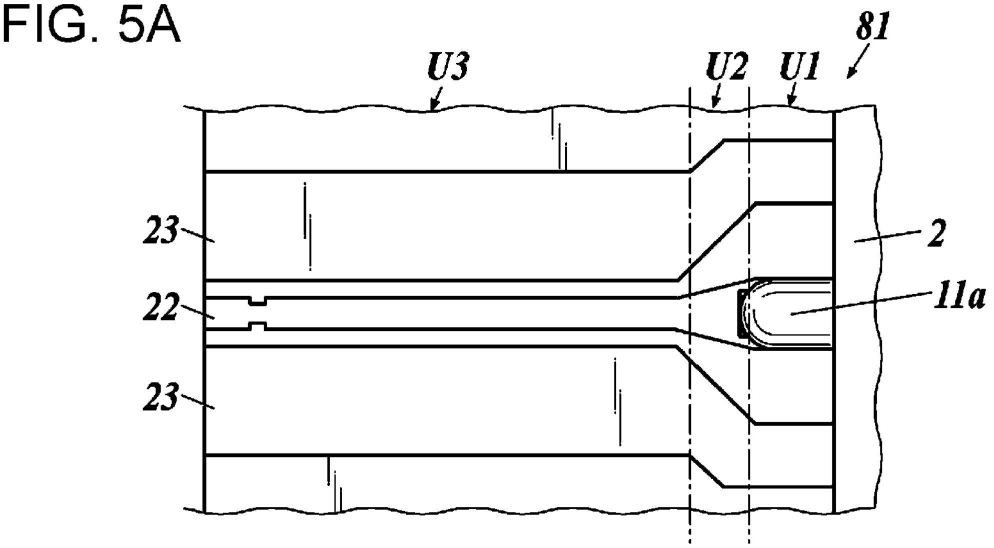
FIG. 5A is a plan view of the transmission line of Comparative Example 1.
Figure 5B:
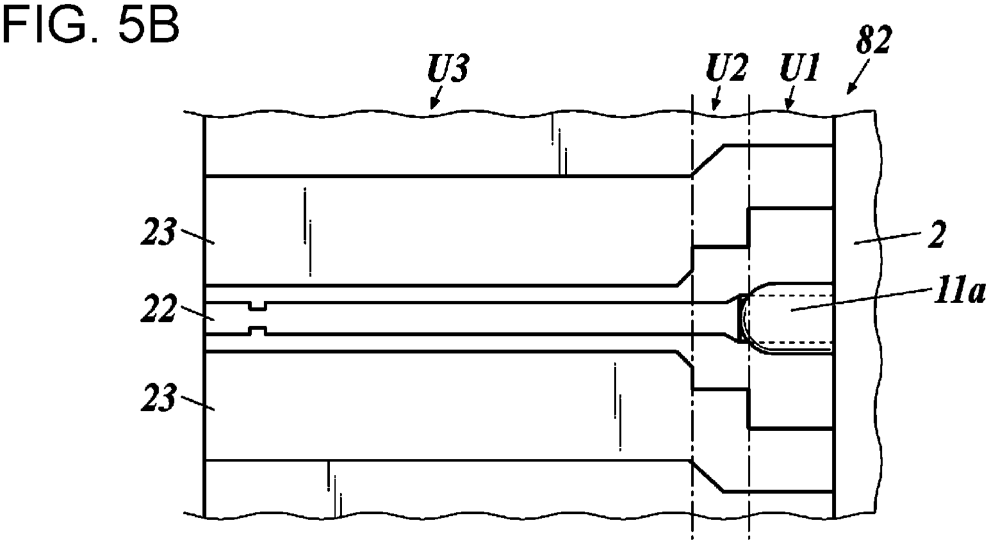
FIG. 5B is a plan view of the transmission line of Comparative Example 2.
Figure 5C:
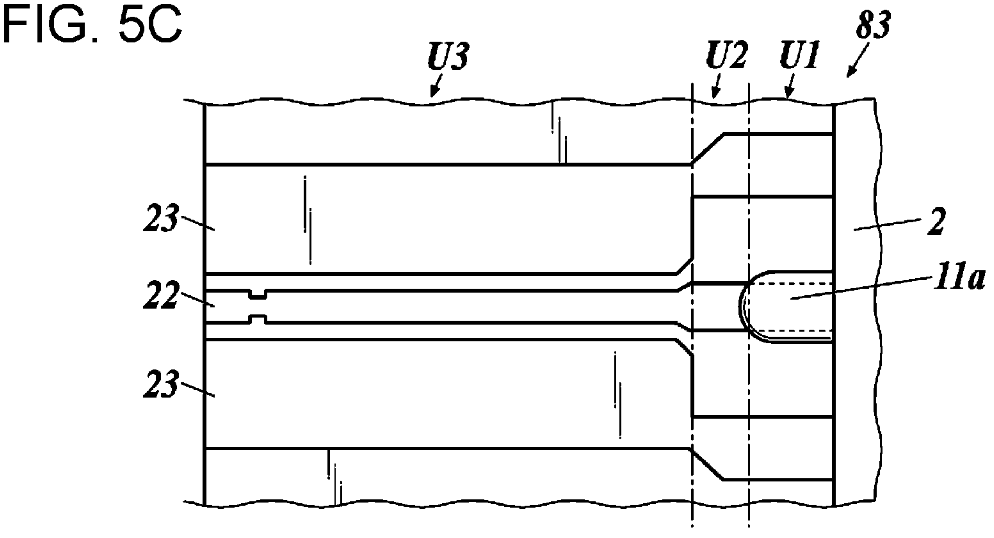
FIG. 5C is a plan view of the transmission line of Comparative Example 3.

FIG. 4A is a graph illustrating the reflection characteristics of transmission lines of the embodiment and Comparative Examples 1 to 3. FIG. 4B is a graph illustrating the transmission characteristics of the transmission lines of the embodiment and Comparative Examples 1 to 3. FIGS. 5A to 5C are plan views of transmission lines 81 to 83 of Comparative Examples 1 to 3, respectively.

As indicated by the characteristics lines of the embodiment in FIG. 4, the simulation results indicate that the transmission line of the package 1 for accommodating an electronic element according to the present embodiment provides good frequency characteristics in which the return loss and the insertion loss are low, in other words, the reflection coefficient is small and the transmission coefficient is large, in a high frequency range such as 80 GHz.

In the plate-shaped signal line 20 (a coplanar line with a backside conductor), the width of the signal conductor 22 and the distance between the signal conductor 22 and each first ground conductor 23 are limited by the requirement with respect to frequency characteristics, except for sections close to the start end or the terminal end. In the first section U1 where the signal line 20 is connected to the pin terminal 11*a*, the shape and dimensions of the signal conductor 22 and the shapes and dimensions of the portions between the signal conductor 22 and the first ground conductors 23 are limited to meet requirements with respect to the frequency characteristics, the strength, and the like. Specifically, the width of the signal conductor 22 in the first section U1 is designed to be greater than the width in the center portion U3*c* of the third section U3, and the distance between the signal conductor 22 and each first ground conductor 23 in the first section U1 is designed to be greater than the distance in the center portion U3*c* of the third section U3.

In the transmission lines 81 to 83 of the comparative examples in FIGS. 5A to 5C, the signal conductor 22 and the portions between the signal conductor 22 and the first ground conductors 23 in the first section U1 and the third section U3 have shapes and dimensions that are the same as and/or similar to those in the embodiment in FIG. 3. In the second section U2, the shapes and dimensions of the signal conductor 22 and the portions between the signal conductor 22 and the first ground conductors 23 are different from those of the embodiment in FIG. 3.

The transmission line 81 in FIG. 5A is an example in which the signal conductor 22 and the first ground conductors 23 have a tapered shape in the second section U2 so that the signal conductor 22 and the first ground conductors 23 in the first section U1 are connected to the signal conductor 22 and the first ground conductors 23 in the third section U3 without a step.

The transmission line 82 in FIG. 5B is an example in which the width of the signal conductor 22 is large approximately only at a portion connected to the pin terminal 11*a*, and the distance between the signal conductor 22 and each first ground conductor 23 decreases stepwise. In Comparative Example 2, the shapes and dimensions of the sides of the first ground conductors 23 facing the signal conductor 22 are the same as and/or similar to those in the embodiment in FIG. 3.

The transmission line 83 in FIG. 5C is an example in which the width of the signal conductor 22 is large from the first section U1 to the second section U2 as with the portion connected to the pin terminal 11*a*, and the distance between the signal conductor 22 and each first ground conductor 23 is also large in the second section U2 as in the first section U1. In Comparative Example 3, the shape and dimensions of the signal conductor 22 are the same as and/or similar to those in the embodiment in FIG. 3.

The transmission line of the package 1 for accommodating an electronic element according to the embodiment is different from the transmission lines 81 to 83 of Comparative Examples 1 to 3 in the shape and dimensions of the signal conductor 22 and the shapes and dimensions of the portions between the signal conductor 22 and the first ground conductors 23 in the second section U2.

As indicated by the simulation results in FIGS. 4A and 4B, the transmission line of the package 1 for accommodating an electronic element according to the embodiment has significantly good frequency characteristics in a high frequency range such as 80 GHz, even when compared with the transmission lines 81 to 83 of Comparative Examples 1 to 3.

<Length of Second Section U2>

Figure 6A:
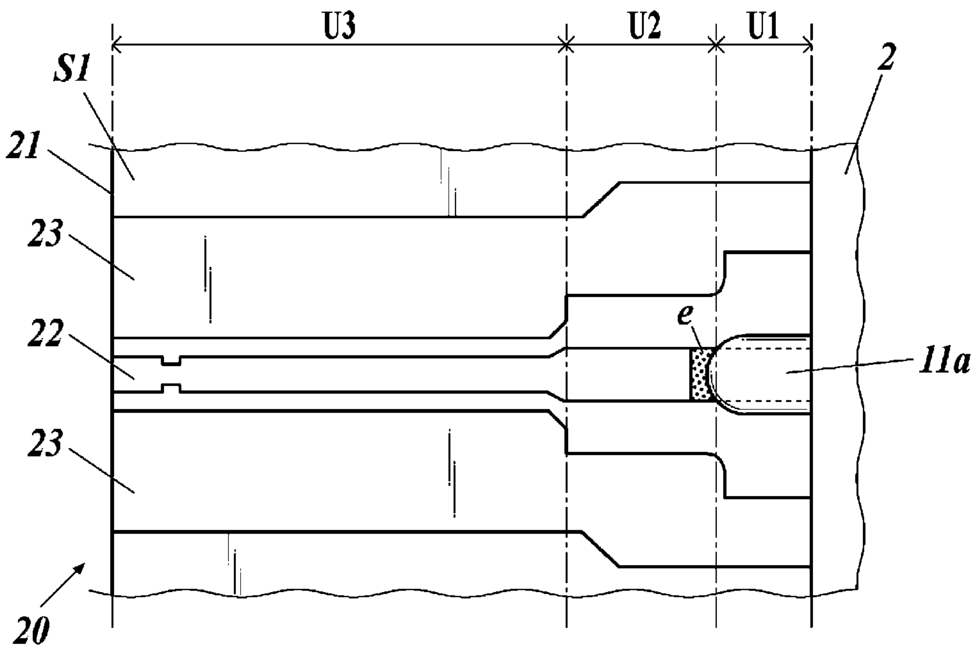
FIG. 6A is a plan view of a first example of the transmission line according to the embodiment in which a second section has a different length.
Figure 6B:
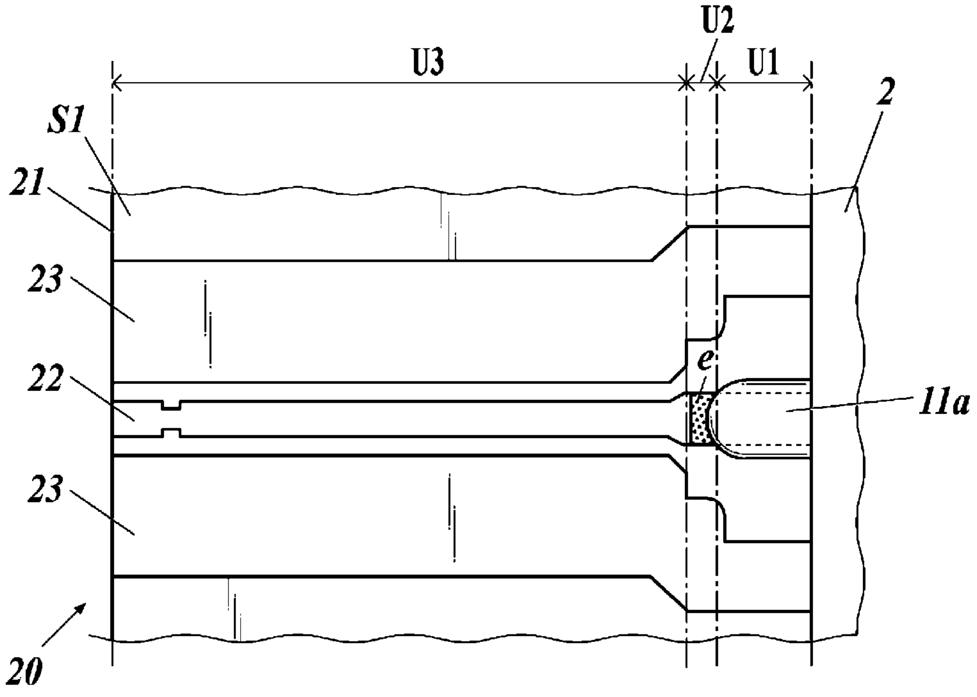
FIG. 6B is a plan view of a second example of the transmission line according to the embodiment in which the second section has a different length.
Figure 7A:
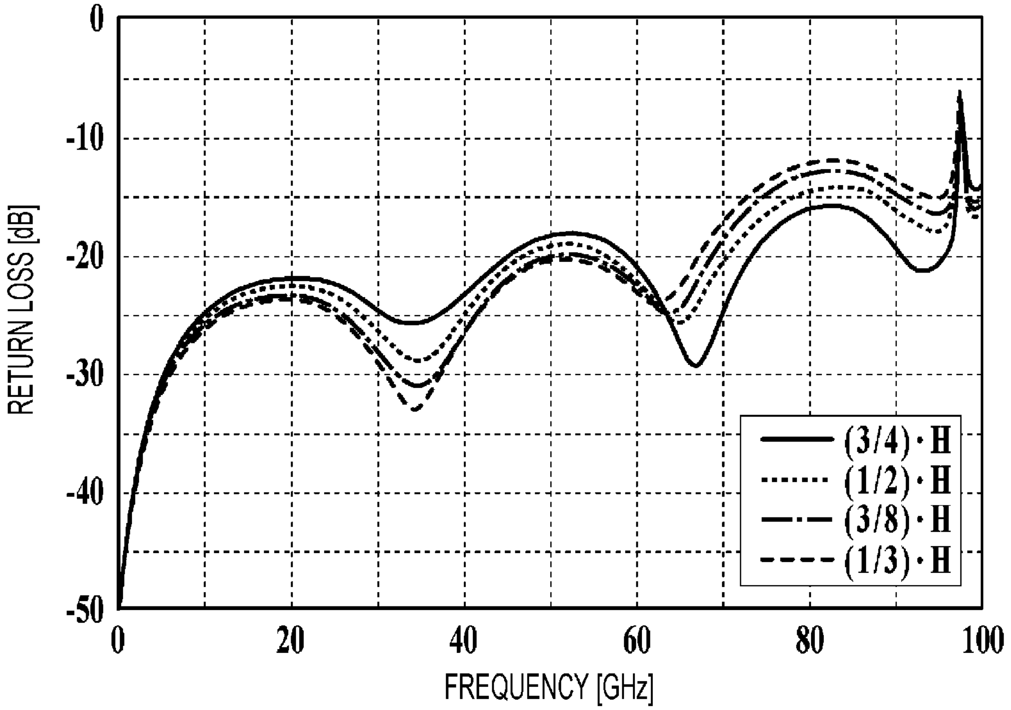
FIG. 7A is a graph illustrating the reflection characteristics of transmission lines in cases in which the second section is shorter.
Figure 7B:
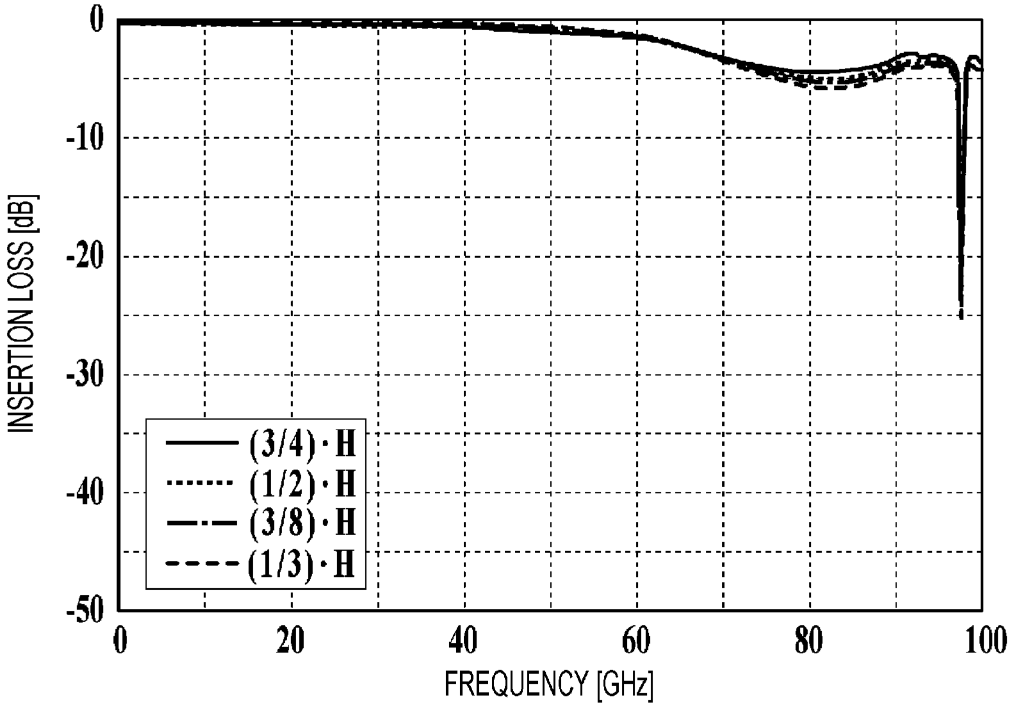
FIG. 7B is a graph illustrating the transmission characteristics of the transmission lines in the cases in which the second section is shorter.
Figure 8A:
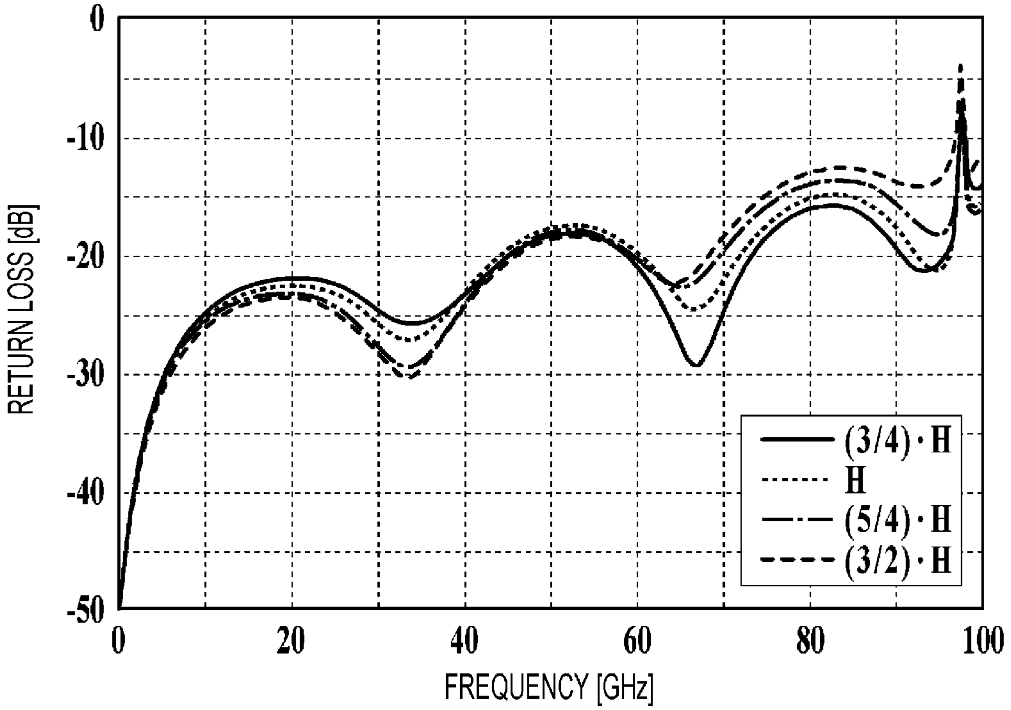
FIG. 8A is a graph illustrating the reflection characteristics of transmission lines in cases in which the second section is longer.
Figure 8B:
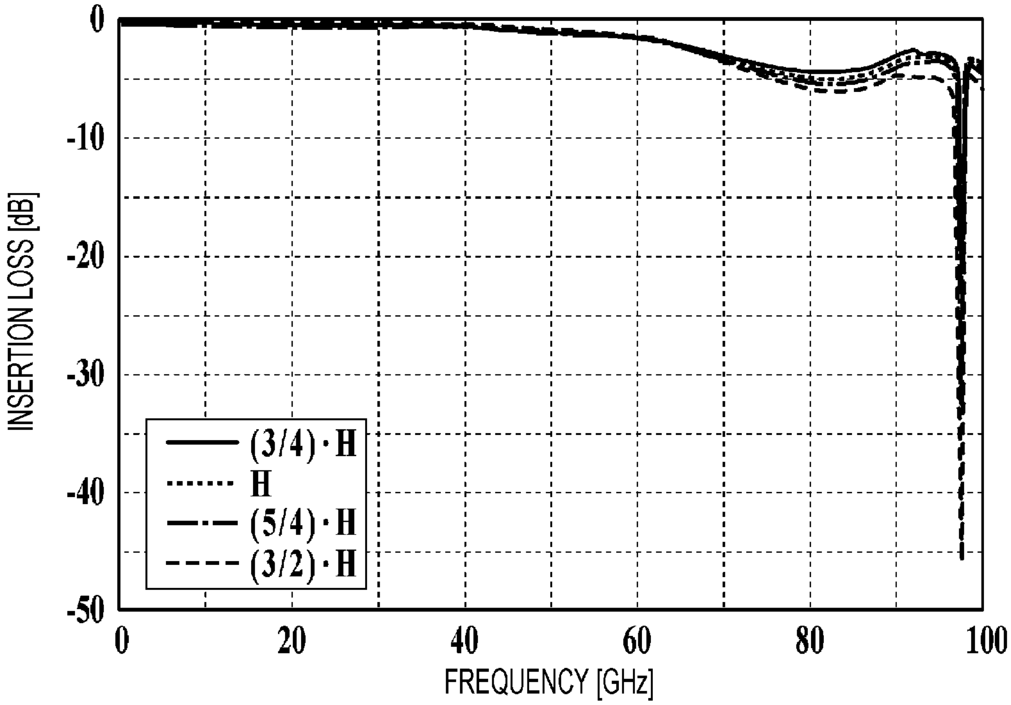
FIG. 8B is a graph illustrating the transmission characteristics of the transmission lines in the cases in which the second section is longer.

FIG. 6A is a plan view of a first example in which the second section U2 has a different length. FIG. 6B is a plan view of a second example of the transmission line according to the embodiment in which the second section has a different length. FIG. 7A is a graph illustrating reflection characteristics in cases in which the second section is shorter. FIG. 7B is a graph illustrating the transmission characteristics of transmission lines in the cases in which the second section is shorter. FIG. 8A is a graph illustrating reflection characteristics in cases in which the second section is longer. FIG. 8B is a graph illustrating the transmission characteristics of transmission lines in the cases in which the second section is longer.

As illustrated in FIGS. 6A and 6B, different lengths of the second section U2 make a difference in the frequency characteristics of the transmission line. FIGS. 7A, 7B, 8A, and 8B illustrate the frequency characteristics of the transmission lines in the cases in which the length of the second section U2 is (⅓)×H, (⅜)×H, (½)×H, (¾)×H, 1×H, (5/4)×H, and (3/2)×H. The length H is the distance between the signal conductor 22 and the second ground conductor 24.

As illustrated in FIGS. 7A, 7B, 8A, and 8B, in the case in which the length of the second section U2 is from (⅓)×H to (3/2)×H, the frequency characteristics are good, and in the case in which the length of the second section U2 is from (½)×H to 1×H, the frequency characteristics are better.

(Variation 1)

Figure 9A:
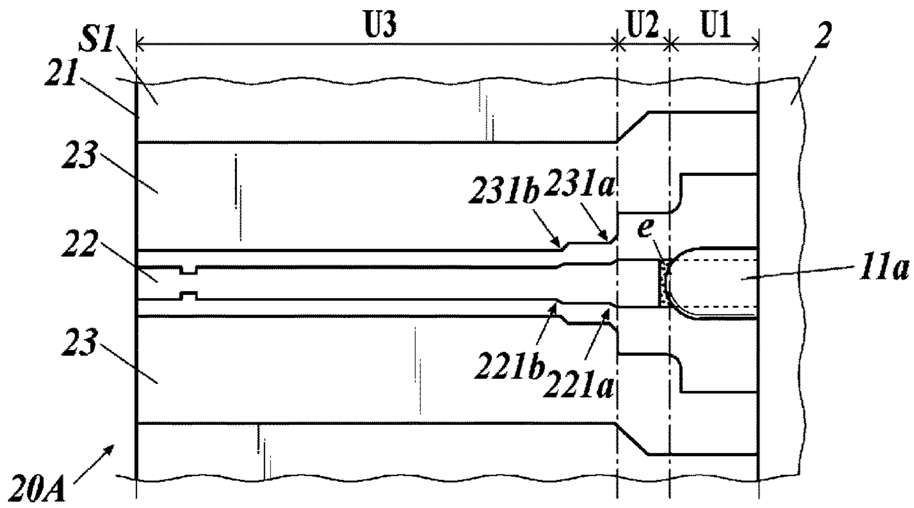
FIG. 9A is a plan view of variation 1 of the transmission line according to the embodiment.
Figure 9B:
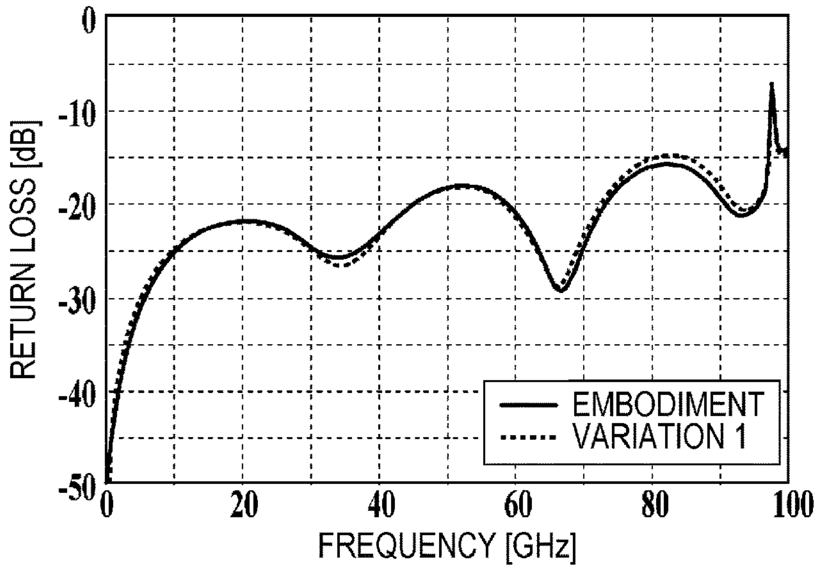
FIG. 9B is a graph illustrating the reflection characteristics of variation 1 of the transmission line according to the embodiment.
Figure 9C:
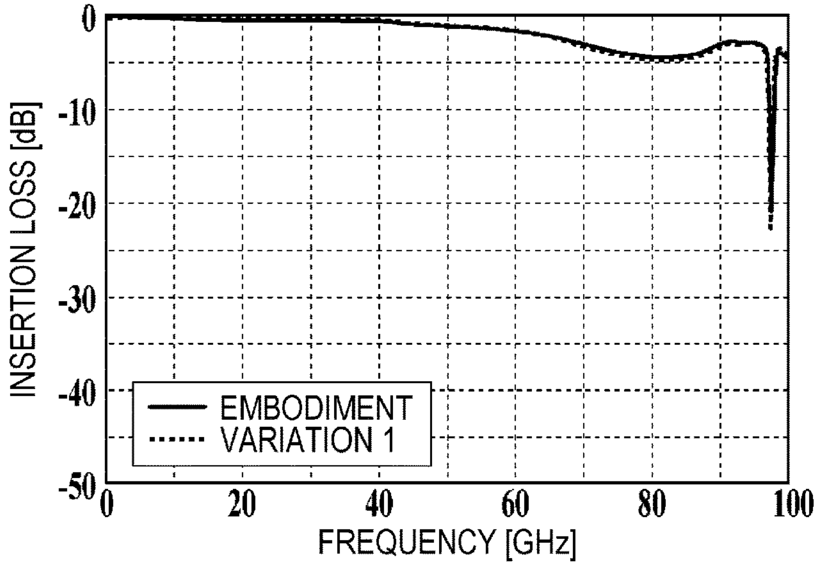
FIG. 9C is a graph illustrating the transmission characteristics of variation 1 of the transmission line according to the embodiment.

FIG. 9A is a plan view of variation 1 of the transmission line according to the embodiment. FIG. 9B is a graph illustrating the reflection characteristics of variation 1 of the transmission line according to the embodiment. FIG. 9C is a graph illustrating the transmission characteristics of variation 1 of the transmission line according to the embodiment. As illustrated in FIG. 9A, a signal line 20A of variation 1 includes step portions 221*a* and 221*b* at which the width of the signal conductor 22 decreases stepwise in an end portion of the third section U3 (on the side closer to the second section U2). In addition, the signal line 20A of variation 1 includes step portions 231*a* and 231*b* at which the distance between the signal conductor 22 and each first ground conductor 23 decreases stepwise on the inner sides (on the sides closer to the signal conductor 22) of the first ground conductors 23.

In the signal line 20A of variation 1, the second section U2 does not include the step portions 221*a*, 221*b*, 231*a*, and 231*b* and has a length of from (⅓)×H to (3/2)×H.

As illustrated in FIGS. 9B and 9C, although the signal line 20A includes the step portions 221*a*, 221*b*, 231*a*, and 231*b* in the third section U3, the signal line 20A provides good frequency characteristics as with the embodiment described above because the second section U2 has a length of from (⅓)×H to (3/2)×H.

<Variation 2>

Figure 10A:
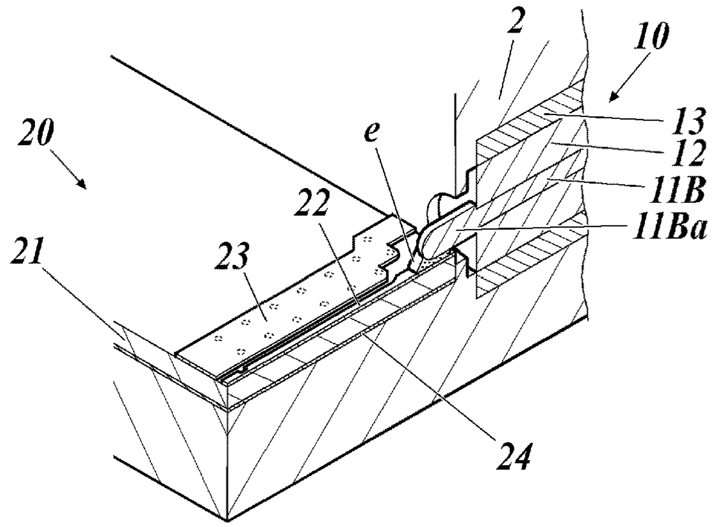
FIG. 10A is a cross-sectional perspective view of variation 2 of the transmission line according to the embodiment.
Figure 10B:
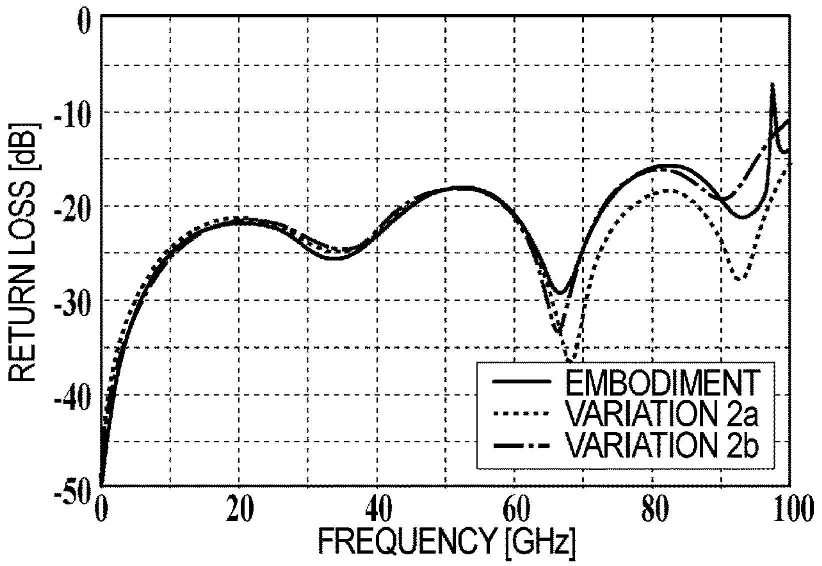
FIG. 10B is a graph illustrating the reflection characteristics of variation 2 of the transmission line according to the embodiment.
Figure 10C:
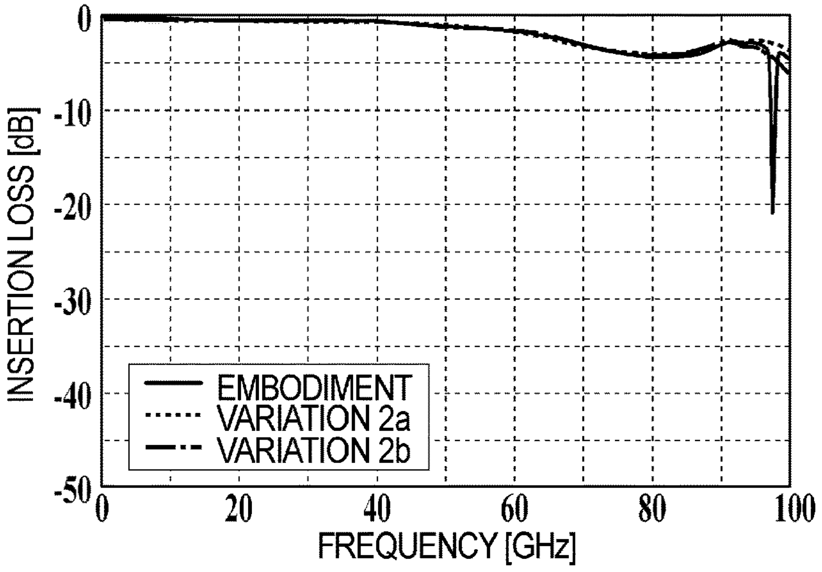
FIG. 10C is a graph illustrating the transmission characteristics of variation 2 of the transmission line according to the embodiment.

FIG. 10A is a cross-sectional perspective view of variation 2 of the transmission line according to the embodiment. FIG. 10B is a graph illustrating the reflection characteristics of variation 2 of the transmission line according to the embodiment. FIG. 10C is a graph illustrating the transmission characteristics of variation 2 of the transmission line according to the embodiment. Variation 2 is an example in which the diameter of an inner conductor 11B and the diameter of a pin terminal 11Ba of the coaxial line 10 are different. In the example of FIG. 10A, the pin terminal 11Ba has the same diameter as the pin terminal 11*a* of the embodiment in FIG. 3, and the inner conductor 11B is narrower than the inner conductor 11 of the embodiment in FIG. 3. In other words, the pin terminal 11Ba has a larger diameter than the inner conductor 11. This configuration is referred to as variation 2*a*. In addition, a configuration in which both the pin terminal 11Ba and the inner conductor 11B are narrower than the pin terminal 11*a* and the inner conductor 11 of the embodiment in FIG. 3 is referred to as variation 2*b*. Note that in variations 2*a* and 2*b*, the diameter or the relative permittivity of the dielectric 12 is adjusted so that impedance mismatching will not occur in the coaxial line 10 due to the change in the diameter of the inner conductor 11B.

As illustrated in FIGS. 10B and 10C, variation 2*b*, including the pin terminal 11Ba and the inner conductor 11B each having a smaller diameter, also provides good frequency characteristics in a high frequency range such as 80 GHz. Variation 2*a*, which includes the pin terminal 11Ba having a larger diameter than the inner conductor 11B, provides better frequency characteristics than the embodiment in FIG. 3 and variation 2*b* in a high frequency range such as 80 GHz.

As described above, in the package 1 for accommodating an electronic element according to the present embodiment, the signal line 20 includes, in order from the coaxial line 10 side, the first section U1, the second section U2, and the third section U3, and the width wa2 of the signal conductor 22 in the second section U2 is constant, is less than or equal to the width wa1 of the signal conductor 22 in the first section U1, and is greater than the width wa3 of the signal conductor 22 in the third section U3. The distance wb2 between the signal conductor 22 and each first ground conductor 23 in the second section U2 is constant, is less than the distance wb1 in the first section U1, and is greater than the distance wb3 in the center portion U3*c* of the third section U3. The second section U2 has a length of from (⅓)×H to (3/2)×H on the side opposite to the coaxial line 10 from the position at which the distal end portion of the pin terminal 11*a* of the coaxial line 10 is present as viewed in the direction perpendicular to the first surface S1 of the insulation plate 21. This configuration makes it possible to achieve good frequency characteristics with a small reflection coefficient and a large transmission coefficient in a high frequency range such as 80 GHz.

In the package 1 for accommodating an electronic element according to the present embodiment, the width of the signal conductor 22 in the second section U2 is less than the width (the diameter w0) of the pin terminal 11*a*. This configuration makes it possible to achieve better frequency characteristics in a high frequency range such as 80 GHz.

In the package 1 for accommodating an electronic element according to the present embodiment, both sides ha2 and hb2 of the signal conductor 22 in the second section U2 are parallel to the longitudinal direction of the signal conductor 22. In addition, the sides hc2 and hd2 of the first ground conductors 23 closer to the signal conductor 22 are parallel to the longitudinal direction of the signal conductor 22. This configuration makes it possible to achieve better frequency characteristics in a high frequency range such as 80 GHz. Note that the signal conductor 22 may include a curved shape. In this case, both sides of the signal conductor 22 in the second section U2 and the sides of the first ground conductors 23 closer to the signal conductor 22 may have a curved shape as with the signal conductor 22.

In the package 1 for accommodating an electronic element according to variation 2*a*, the diameter of the pin terminal 11Ba of the coaxial line 10 is larger than the diameter of the inner conductor 11B. This configuration makes it possible to achieve better frequency characteristics in a high frequency range such as 80 GHz.

The electronic device 100 of the present embodiment, to which the package 1 for accommodating an electronic element is applied, achieves good frequency characteristics in a high frequency range such as 80 GHz.

The embodiment of the present disclosure has been described above. However, the package for accommodating an electronic element and the electronic device according to the present disclosure are not limited to the above embodiment and can be modified as appropriate without departing from the spirit of the invention.

INDUSTRIAL APPLICABILITY

The present disclosure can be applied to packages for accommodating an electronic element and to electronic devices.

REFERENCE SIGNS

1 package for accommodating electronic element
2 wall
3 accommodating portion
4 base
5 lid
6 electronic element
10 coaxial line
11, 11B inner conductor
12 dielectric
13 outer conductor
11*a*, 11Ba pin terminal
w0 diameter of pin terminal
20 signal line
21 insulation plate
S1 first surface
S2 second surface
22 signal conductor
23 first ground conductor
24 second ground conductor
25 via conductor
e joining material
U1 first section
U2 second section
U3 third section
wa1, wa2, wa3 width of signal conductor
wb1, wb2, wb3 distance between signal conductor and each first ground conductor
ha1, hb1, hc1, hd1, ha2, hb2, hc2, hd2 side
100 electronic device
+

The invention claimed is:

1. A package for accommodating an electronic element, comprising:

a base comprising a wall and an accommodating portion surrounded by the wall;

a coaxial line located in the wall; and a signal line connected to the coaxial line on a side of the wall, wherein the coaxial line comprises a pin terminal protruding from the wall, the signal line comprises an insulation plate comprising a first surface and a second surface on a side opposite to the first surface, a signal conductor located on the first surface and connected to the pin terminal, first ground conductors located on the first surface with the signal conductor interposed between the first ground conductors, and a second ground conductor located on the second surface, the signal line includes, in order from the coaxial line side, a first section, a second section, and a third section, a width of the signal conductor in the second section is constant, is less than or equal to a width of the signal conductor in the first section, and is greater than a width of the signal conductor in a center portion of the third section, a distance between the signal conductor and each of the first ground conductors is constant in the second section, is less than the distance in the first section, and is greater than the distance in the center portion of the third section, and the second section has a length of from ⅓ times to $\frac{3}{2}$ times a distance H between the signal conductor and the second ground conductor on a side opposite to the coaxial line from a position at which a distal end portion of the pin terminal is present as viewed in a direction perpendicular to the first surface.

2. The package for accommodating an electronic element according to claim 1, wherein the width of the signal conductor in the second section is less than a width of the pin terminal.

3. The package for accommodating an electronic element according to claim 1, wherein both sides of the signal conductor in the second section are parallel to a longitudinal direction of the signal conductor, and sides of the first ground conductors closer to the signal conductor in the second section are parallel to the longitudinal direction of the signal conductor.

4. The package for accommodating an electronic element according to claim 1, wherein the coaxial line further comprises an inner conductor continuous with the pin terminal and a dielectric located around the inner conductor, and a diameter of the pin terminal is larger than a diameter of the inner conductor.

5. An electronic device comprising:

the package for accommodating an electronic element according to claim 1; and an electronic element accommodated in the accommodating portion.

* * * * *